United States Patent [19]

Chaffin, III

[11] 3,996,548

[45] Dec. 7, 1976

[54] PHOTODETECTOR-TO-SUBSTRATE BONDS

[75] Inventor: John H. Chaffin, III, Minnetonka, Minn.

[73] Assignee: Honeywell Inc., Minneapolis, Minn.

[22] Filed: Nov. 19, 1975

[21] Appl. No.: 633,531

[52] U.S. Cl. .................................. 338/15; 228/122
[51] Int. Cl.² ........................................ H01L 31/08
[58] Field of Search ............... 338/15, 18; 228/122; 29/572, 626; 250/200, 211 R; 357/67, 65

[56] References Cited
OTHER PUBLICATIONS

J. M. Engel, High Thermal Conductance Substrate, "IBM Technical Disclosure Bulletin", vol. 4, No. 8, p. 59, Jan. 1962.

L. S. Goldmann et al., Lead–Indium for Joining a Semiconductor Chip to a Substrate, "IBM Technical Disclosure Bulletin", vol. 16, No. 11, p. 3610, Apr. 1974.

*Primary Examiner*—C. L. Albritton
*Attorney, Agent, or Firm*—David Fairbairn

[57] ABSTRACT

A photodetector is bonded to an electrically conductive substrate with an indium containing solder. An electrical insulating layer of a stable oxide which is wettable by indium provides electrical insulation between the electrically conductive substrate and the photodetector.

9 Claims, 1 Drawing Figure

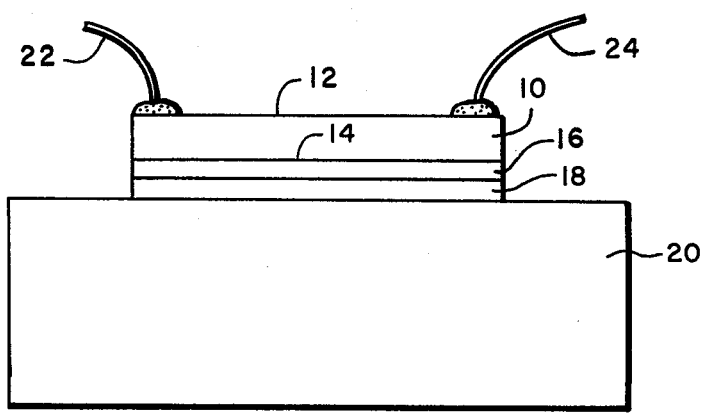

PHOTODETECTOR-TO-SUBSTRATE BONDS

ORIGIN OF THE INVENTION

This invention was made in the course of a contract with the Department of the Navy.

BACKGROUND OF THE INVENTION

This invention relates to photosensitive devices. In particular, the present invention is an improved bond and bonding technique for bonding photodetector devices to electrically conductive substrates.

It is desirable for certain applications to bond photodetectors such as mercury cadmium telluride infrared photoconductive detectors to a heat sink in order to raise the thermal damage threshold of the detector. Heat transfer across the entire bond interface should be as high as possible.

A problem which is encountered particularly with photoconductive detectors is that the bond and the heat sink (which is usually electrically conductive) must not short out the detector. It is necessary, therefore, to provide a bond which has high thermal conductivity while providing electrical insulation between the photodetector and the metal heat sink.

One previous approach has consisted of epoxy bonding a mercury cadmium telluride photoconductive detector to a copper heat sink. The epoxy is an electrical insulator as well as a bonding material. This technique, however, is limited by the poor thermal conductivity of epoxy.

Another approach consists of evaporating an insulating layer of zinc sulfide onto the back surface of the mercury cadmium telluride photoconductive detector. A chromium layer is then deposited on the zinc sulfide, followed by a gold layer. Indium, which wets gold (but not zinc sulfide), is then used to solder the detector to the metal heat sink. The disadvantage of this approach is that multiple layers must be evaporated to achieve an insulating, solderable surface. This results in a higher probability of bonding failure due to delamination of the coatings and a higher cost due to increased fabrication steps.

SUMMARY OF THE INVENTION

In the present invention, a photodetector is bonded to an electrically conductive substrate. An electrically insulating layer is formed on a surface of the photodetector. The electrically insulating layer is a stable electrically insulating oxide which is wettable by indium. A bonding layer of indium or an indium alloy bonds the photodetector and electrical insulating layer to the electrically conductive substrate.

BRIEF DESCRIPTION OF THE DRAWING

The FIGURE shows a preferred embodiment of the photosensitive device of the present invention.

DETAILED DESCRIPTION OF THE PREFERRED EMBODIMENTS

In the Figure, a preferred embodiment of the present invention is shown. Photodetector 10 has first and second surfaces 12 and 14, respectively. An electrically insulating layer 16 is attached to surface 14 of detector 10. Bonding layer 18 bonds photodetector 10 and electrically insulating layer 16 to electrically conductive substrate 20. Electrical contacts 22 and 24 are attached to surface 12 of detector 10.

In the present invention, photodetector 10 is preferably a photoconductive detector of a semiconductor material such as mercury cadmium telluride. Other photodetector materials such as indium antimonide and lead tin telluride, however, may also be used.

Electrical insulating layer 16 is a stable electrically insulating oxide which is directly wettable by indium. Preferred oxides include stable insulating metal oxides such as chromium oxides, iron oxides, and cobalt oxides. Another preferred material is cadmium tellurite ($CdTeO_3$). The preparation of cadmium tellurite is described in further detail in the copending application by J. H. Chaffin, III, and R. A. Skogman entitled "Cadmium Tellurite Thin Films", Ser. No. 633,538 which was filed on even date herewith and which is assigned to the same assignee as the present invention.

An important attribute of the insulating layer 16 is that the oxide is directly wettable by indium at the melting point of indium (157° C). This allows direct bonding of the insulating layer to the conductive substrate by an indium or indium based solder. The disadvantages of the prior art bonding technique using zinc sulfide as an insulator are overcome, because the additional metal layers required by the prior art technique are eliminated with the present invention.

Bonding layer 18 is an indium or indium alloy solder. These solders have the advantage of having a very low melting point. This is particularly important when the photodetector is mercury cadmium telluride because high temperatures during bonding can adversely effect the electrical properties of mercury cadmium telluride. Substrate 20 is preferably copper, aluminum or another metal having a high thermal conductivity.

The present invention has resulted in strong and reliable bonds with a minimum of layers between the photodetector and the conductive substrate. Mercury cadmium telluride photodetector devices which were bonded to copper heat sinks by the present invention have exhibited good heat transfer properties between the detector and the heat sink.

Another important advantage of the present invention is the simplicity of fabrication of the bond. In the preferred embodiments, insulating layer 16 is sputter deposited on surface 14 of detector 10. The oxide preferably is formed by reactive sputtering in an oxygen atmosphere. For example, a chromium oxide is formed by reactive sputtering of a chromium target in an oxygen atmosphere. Similarly, cadmium tellurite is formed by reactive sputtering of a cadmium telluride (CdTe) target in an oxygen atmosphere. The preferred pressure of the oxygen during sputtering is about $2 \times 10^{-3}$ to about $2 \times 10^{-2}$ torr.

A further advantage of sputter depositing insulating layer 16 is that it is possible to sputter clean surface 14 of detector 10 immediately prior to depositing insulating layer 16. Since this process can be performed in the same sputtering apparatus, recontamination of surface 14 after cleaning is minimized.

After layer 16 has been sputter deposited, the detector 10 and insulating layer 16 are bonded to substrate 20 by soldering with an indium-base solder. The solder forms bonding layer 18 as shown in the Figure.

In conclusion, the present invention provides a bond for photodetectors to a heat sink. The advantages of the present invention include good heat transfer between the detector and the substrate, strong and reliable bonding, and simplicity of fabrication.

Although this invention has been described with reference to preferred embodiments, workers skilled in the art will recognize that changes may be made in form and details without departing from the spirit and scope of the invention.

The embodiments of the invention in which an exclusive property or right is claimed are defined as follows:

1. A photosensitive device comprising:
   a photodetector;
   an electrically insulating layer on a surface of the photodetector, the electrically insulating layer being a stable electrically insulating oxide which is wettable by indium;
   an electrically conductive substrate; and
   a bonding layer between the electrically insulating layer and the electrically conductive substrate for bonding the photodetector to the electrically conductive substrate, the bonding layer being a metal of the group consisting of indium and alloys thereof.

2. The photosensitive device of claim 1 wherein the electrically insulating layer is a stable metal oxide.

3. The photosensitive device of claim 2 wherein the electrically insulating layer is of the group consisting of oxides of chromium, iron, and nickel.

4. The photosensitive device of claim 3 wherein the electrically insulating layer is a chromium oxide.

5. The photosensitive device of claim 1 wherein the electrically insulating layer is cadmium tellurite.

6. The photosensitive device of claim 1 wherein the photodetector is a mercury cadmium telluride photodetector.

7. The photosensitive device of claim 6 wherein the mercury cadmium telluride photodetector is a photoconductive detector.

8. The photosensitive device of claim 7 wherein the electrically insulating layer is a chromium oxide.

9. The photosensitive device of claim 7 wherein the electrically insulating layer is cadmium tellurite.

* * * * *